US010325908B2

United States Patent
Lui et al.

(10) Patent No.: US 10,325,908 B2
(45) Date of Patent: Jun. 18, 2019

(54) COMPACT SOURCE BALLAST TRENCH MOSFET AND METHOD OF MANUFACTURING

(71) Applicant: Alpha and Omega Semiconductor (Cayman) Ltd., Grand Cayman (KY)

(72) Inventors: Sik Lui, Sunnyvale, CA (US); Madhur Bobde, Sunnyvale, CA (US); Ji Pan, San Jose, CA (US)

(73) Assignee: ALPHA AND OMEGA SEMICONDUCTOR INCORPORATED, Grand Cayman (KY)

(*) Notice: Subject to any disclaimer, the term of this patent is extended or adjusted under 35 U.S.C. 154(b) by 0 days.

(21) Appl. No.: 15/498,289

(22) Filed: Apr. 26, 2017

(65) Prior Publication Data

US 2018/0315749 A1 Nov. 1, 2018

(51) Int. Cl.
| H01L 29/78 | (2006.01) |
| H01L 27/06 | (2006.01) |
| H01L 29/417 | (2006.01) |
| H01L 29/10 | (2006.01) |
| H01L 29/08 | (2006.01) |

(Continued)

(52) U.S. Cl.
CPC ........ *H01L 27/0629* (2013.01); *H01L 29/086* (2013.01); *H01L 29/0865* (2013.01); *H01L 29/1095* (2013.01); *H01L 29/167* (2013.01); *H01L 29/41741* (2013.01); *H01L 29/66727* (2013.01); *H01L 29/66734* (2013.01); *H01L 29/7806* (2013.01); *H01L 29/7813* (2013.01)

(58) Field of Classification Search
CPC .................. H01L 29/7806; H01L 29/7813
See application file for complete search history.

(56) References Cited

U.S. PATENT DOCUMENTS

| 5,998,833 A | 12/1999 | Baliga |
| 6,479,352 B2 | 11/2002 | Blanchard |
| 6,927,458 B2 | 8/2005 | Worley |

(Continued)

FOREIGN PATENT DOCUMENTS

WO 2015114803 A1 8/2015

OTHER PUBLICATIONS

Non-Final Office Action for U.S. Appl. No. 15/498,366, dated Feb. 22, 2018.

*Primary Examiner* — Mark V Prenty
(74) *Attorney, Agent, or Firm* — JDI Patent; Joshua Isenberg; Robert Pullman

(57) ABSTRACT

A trench metal-oxide-semiconductor field-effect transistor (MOSFET) device, comprising a substrate of a first conductivity type, a body region of a second conductivity type, a gate electrode formed in a gate trench extending in the body region and substrate, a lightly doped source region and a heavily doped source region formed in the body region, and a source contact extending to the body region formed in a source contact trench next to the gate trench. The lightly doped source region is extended deeper in the body region than the heavily doped source region. The lightly doped source region is adjacent to the source contact trench. A ballast resistor is formed at the lightly doped source region between the heavily doped source region and the body region and a Schottky diode is formed at a contact between the source contact and the lightly doped source region.

8 Claims, 16 Drawing Sheets

(51) Int. Cl.
*H01L 29/66* (2006.01)
*H01L 29/167* (2006.01)

(56) References Cited

U.S. PATENT DOCUMENTS

| | | | |
|---|---|---|---|
| 7,345,342 B2 | 3/2008 | Challa et al. |
| 7,816,720 B1 | 10/2010 | Hsieh |
| 8,138,605 B2 | 3/2012 | Chang et al. |
| 8,324,683 B2 | 12/2012 | Lui et al. |
| 8,394,702 B2 | 3/2013 | Tai et al. |
| 8,502,302 B2 | 8/2013 | Su et al. |
| 8,507,978 B2 | 8/2013 | Bhalla et al. |
| 8,580,676 B2 | 11/2013 | Chang et al. |
| 8,703,563 B2 | 4/2014 | Hebert et al. |
| 8,748,268 B1 | 6/2014 | Pan et al. |
| 8,785,270 B2 | 7/2014 | Su et al. |
| 8,809,948 B1 | 8/2014 | Yilmaz et al. |
| 8,828,857 B2 | 9/2014 | Lui et al. |
| 8,907,416 B2 | 12/2014 | Tai et al. |
| 8,933,506 B2 | 1/2015 | Bobde et al. |
| 8,946,816 B2 | 2/2015 | Bobde et al. |
| 8,951,867 B2 | 2/2015 | Lee et al. |
| 8,969,950 B2 | 3/2015 | Pan |
| 8,980,716 B2 | 3/2015 | Lui et al. |
| 9,006,053 B2 | 4/2015 | Pan et al. |
| 9,082,790 B2 | 7/2015 | Bobde et al. |
| 9,105,494 B2 | 8/2015 | Lee et al. |
| 9,136,380 B2 | 9/2015 | Yilmaz et al. |
| 9,190,512 B2 | 11/2015 | Lee et al. |
| 9,214,545 B2 | 12/2015 | Tai et al. |
| 9,230,957 B2 | 1/2016 | Lui et al. |
| 9,252,264 B2 | 2/2016 | Bobde et al. |
| 9,391,061 B2 | 7/2016 | Guan et al. |
| 9,412,733 B2 | 8/2016 | Calafut et al. |
| 9,450,088 B2 | 9/2016 | Lee et al. |
| 9,484,452 B2 | 11/2016 | Bobde et al. |
| 9,484,453 B2 | 11/2016 | Yilmaz et al. |
| 9,502,554 B2 | 11/2016 | Bobde et al. |
| 9,530,885 B2 | 12/2016 | Bobde et al. |
| 9,564,516 B2 | 2/2017 | Pan |
| 9,685,435 B2 | 6/2017 | Lui et al. |
| 9,685,523 B2 | 6/2017 | Bobde et al. |
| 9,711,637 B2 | 7/2017 | Numabe et al. |
| 2011/0233667 A1 | 9/2011 | Tai et al. |
| 2012/0025874 A1 | 2/2012 | Saikaku et al. |
| 2012/0068262 A1* | 3/2012 | Pan .............. H01L 29/66734 257/332 |
| 2012/0132988 A1 | 5/2012 | Lui et al. |
| 2012/0193676 A1 | 8/2012 | Bobde et al. |
| 2014/0048846 A1 | 2/2014 | Lui et al. |
| 2014/0231963 A1 | 8/2014 | Guan et al. |
| 2014/0235024 A1 | 8/2014 | Pan et al. |
| 2014/0242771 A1 | 8/2014 | Sharma et al. |
| 2015/0021682 A1 | 1/2015 | Bobde et al. |
| 2015/0097232 A1 | 4/2015 | Tai et al. |
| 2015/0137227 A1 | 5/2015 | Bobde et al. |
| 2015/0171192 A1 | 6/2015 | Pan |
| 2015/0171201 A1 | 6/2015 | Lui et al. |
| 2015/0279989 A1 | 10/2015 | Bobde et al. |
| 2016/0141411 A1 | 5/2016 | Bobde et al. |
| 2016/0300833 A1 | 10/2016 | Guan et al. |

* cited by examiner

100

200

US 10,325,908 B2

COMPACT SOURCE BALLAST TRENCH MOSFET AND METHOD OF MANUFACTURING

FIELD OF THE DISCLOSURE

This disclosure relates in general to metal-oxide-semiconductor field-effect transistors (MOSFETs), and more specifically to an improved trench MOSFET configuration with a source ballast resistor and a method for fabricating the same.

BACKGROUND OF INVENTION

Integrated circuits, such as microprocessors and memory devices, include many metal-oxide-semiconductor field-effect transistors (MOSFETs), which provide the basic switching functions to implement logic gates, data storage, power switching, and the like. When MOSFETs are connected in parallel as shown in FIG. 1A to handle large current in slow switching applications, parameter mismatch (e.g., on resistance, threshold voltage, channel lengths) between MOSFETs results in dynamic current imbalance, and thus causing current hogging. Current hogging takes places when a larger fraction of a current passes through one of several parallel MOSFETs due to lower threshold voltage or channel length. Since that particular MOSFET dissipates most of the device power, localized hot spots appear. The higher temperature further lowers threshold voltage of that MOSFET and draws more power. Ultimately, thermal runaway would occur.

It is known in the field that source ballasting may provide negative feedback to counter current hogging. Thus, in order to avoid current hogging, a source ballast resistor is typically added in series with each MOSFET as shown in FIG. 1B to equalize the distribution of the load current among the parallel MOSFETs. It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Figure 1A:
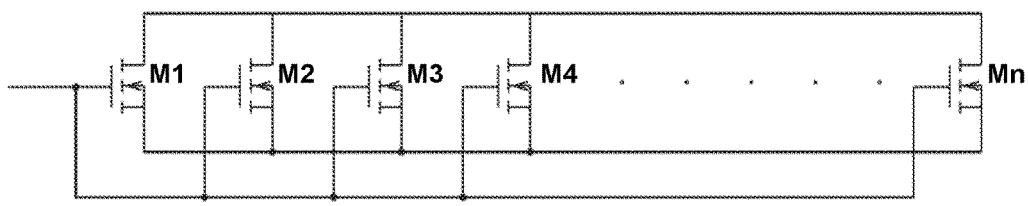
FIG. 1A is a schematic diagram of MOSFETs connected in parallel.
Figure 1B:
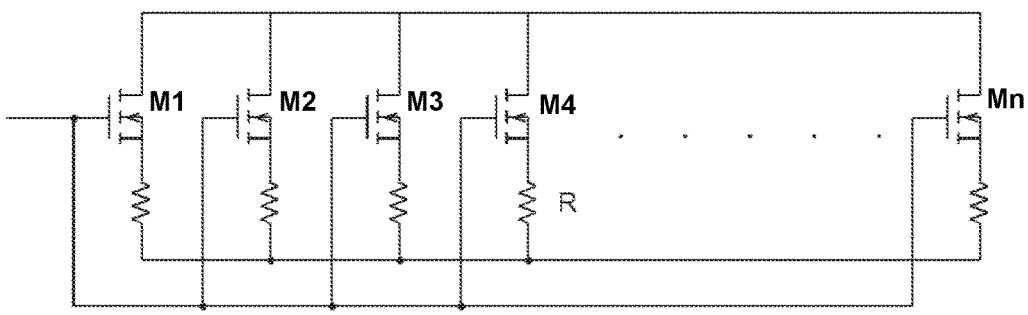
FIG. 1B is a schematic diagram of parallel MOSFETs having a source ballasting resistor connected in series with each MOSFET.

In the following Detailed Description, reference is made to the accompanying drawings, which form a part hereof, and in which is shown by way of illustration specific embodiments in which the invention may be practiced. For convenience, use of +or – after a designation of conductivity or net impurity carrier type (p or n) refers generally to a relative degree of concentration of designated type of net impurity carriers within a semiconductor material. In general terms an n+ material has a higher n type net dopant (e.g., electron) concentration than an n material and an n material has a higher carrier concentration than an n– material. Similarly, a p+ material has a higher p type net dopant (e.g., hole) concentration than a p material and a p material has a higher concentration than a p– material. It is noted that what is relevant is the net concentration of the carriers, not necessarily dopants. For example, a material may be heavily doped with n-type dopants but still have a relatively low net carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

Introduction

Some designs have been proposed for having a ballast resistor connected in series with a MOSFET. U.S. Pat. No. 6,927,458 to Worley, the disclosure of which is hereby incorporated herein as reference, discloses applying ballast structures to both the source and drain regions in a CMOS design. U.S. Pat. No. 7,816,720 to Hsieh and U.S. Pat. No. 8,703,563 to Hebert et al., the disclosure of which are hereby incorporated herein as reference, both mention using source ballast resistors to control gain of the circuit to give more uniformity when the trench MOSETs are connected in parallel. Since these designs have the source ballast resistor laterally connected in series with the heavily doped source region in a MOSFET, the source ballast resistors in these designs would take up a large area. In addition, it requires a new layout/design whenever a change of resistance is needed.

Aspects of the present disclosure disclose an improved configuration of a trench MOSFET device with a contact source ballast structure. Specifically, the trench MOSFET device according to aspects of present disclosure comprises a lightly doped source region forming the ballast structure between the heavily doped source region and the body region. Due to the improved configuration, the ballast resistance can be adjusted easily in a trench MOSFET according to aspects of the present disclosure. Specifically, the resistor length can be adjusted by changing the depth of the heavily doped source region. The resistor width can be adjusted by changing the contact width, e.g., the width of the contact trench as viewed from above. In addition, the resistivity can be adjusted by changing the doping concentration of the lightly-doped source region.

Embodiments

Figure 2A:
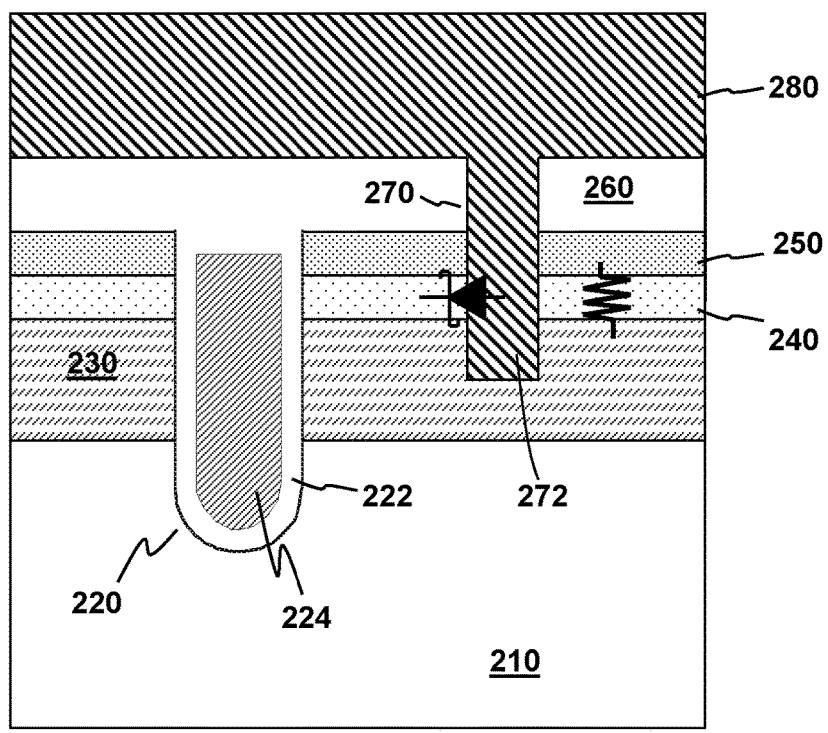
FIG. 2A is a cross-sectional schematic diagram of portions of a trench MOSFET device according to aspects of the present disclosure.
Figure 2B:
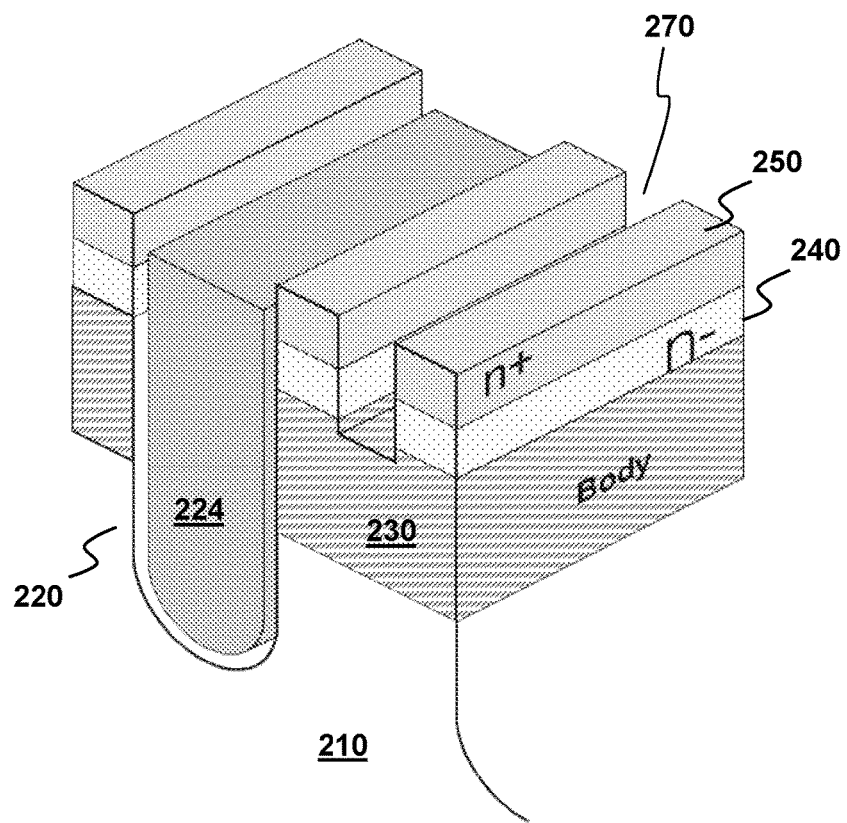
FIG. 2B is a three-dimensional view of the trench MOSFET device of FIG. 2A.

FIG. 2A illustrates a cross-sectional schematic diagram of portions of a trench MOSFET device according to aspects of the present disclosure. FIG. 2B is a three-dimensional view of the trench MOSFET device of FIG. 2A. As with all the other figures described herein, the relative dimensions and sizes of the elements shown do not reflect actual dimensions and are for illustrative purposes only.

The trench MOSFET device 200 starts with a substrate 210. The substrate 210 may include an epitaxial layer of a first conductivity type on top of a heavily doped silicon wafer of the same conductivity type. By way of example, and not by way of limitation, the epitaxial layer and the silicon wafer may be doped with any suitable n-type dopant species (ions or atoms), such as phosphorous or arsenic. The silicon wafer may be heavily doped compared to the doping for the epitaxial layer. The substrate 210 acts as the drain of the trench MOSFET device 200.

A body region 230 of a second conductivity type is formed above the substrate 210. The second conductivity type is opposite to the first conductivity type. In one implementation, the first conductivity type is n-type and the second conductivity type is p-type. The body region 230 may be doped with any suitable p-type dopant species, such as boron.

A gate trench 220 is formed in the body region 230 and extended to the top portions of the substrate 210. The gate trench is lined with a dielectric material 222 such as silicon oxide. A gate electrode 224 is formed in the gate trench 220 and insulated from the body region 230 and substrate 210 by the dielectric material 222 lining the gate trench 220. By way of example, and not by way of limitation, the gate electrode 224 may be composed of polysilicon or any other conductive material.

A lightly doped source region 240 is formed in the top portions of the body region 230 as shown in FIG. 2. The source region 240 may be lightly doped with dopants of the same conductivity type as the substrate 210. By way of example, and not by way of limitation, the doping concentration of the lightly doped source region 240 may range from about $1 \times 10^{15}/cm^3$ to about $1 \times 10^{18}/cm^3$.

A heavily doped source region 250 is formed above the lightly doped source region 240. The source region 250 may be heavily doped with dopants of the same conductivity type as the substrate 210. By way of example, and not by way of limitation, these source regions 250 may be doped with n+ type for an n type substrate 210. In the implementation depicted in FIGS. 2A-2B, the heavily doped source regions 250 span the width of the region between the gate trench 220 and the source contract trench 270.

A dielectric layer 260 is formed on top of the heavily doped source region 250. A source metal pad 280 is provided above the dielectric layer 260. A source contact 272 in a source contact trench 270 also connects the source metal pad 280 to the body region 230. The source metal pad 280 and the source contact 272 serve as the source pad and provide an external connection to the source region 250 of the trench MOSFET device 200.

According to the configuration described above, a ballast structure is formed at the lightly doped source region 240 between the heavily doped source region 250 and the body region 230. In addition, a Schottky diode is formed at the contact between the lightly doped source region 240 and the source contact 272 as shown in FIG. 2 and an ohmic contact is formed at the contact between the heavily doped source region and the source contact 272. Since a Schottky contact is formed to the source-body short, channel electron current passes through the lightly doped source region to the heavily doped source region parallel to the direction of the trench. The ballast resistance can be adjusted easily in a trench MOSFET according to aspects of the present disclosure. Specifically, the resistor length can be adjusted by changing the depth of the heavily doped source region. The resistor width can be adjusted by changing the contact width. Additionally, the resistivity can be adjusted by changing the doping concentration of the lightly-doped source region.

Figure 3A:
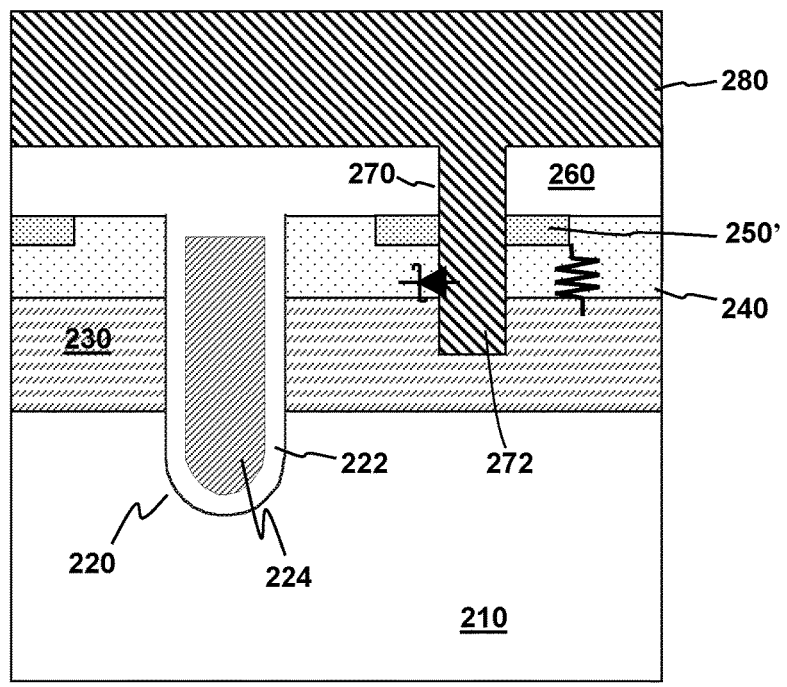
FIG. 3A is a cross-sectional schematic diagram of portions of a trench MOSFET device according to aspects of the present disclosure.
Figure 3B:
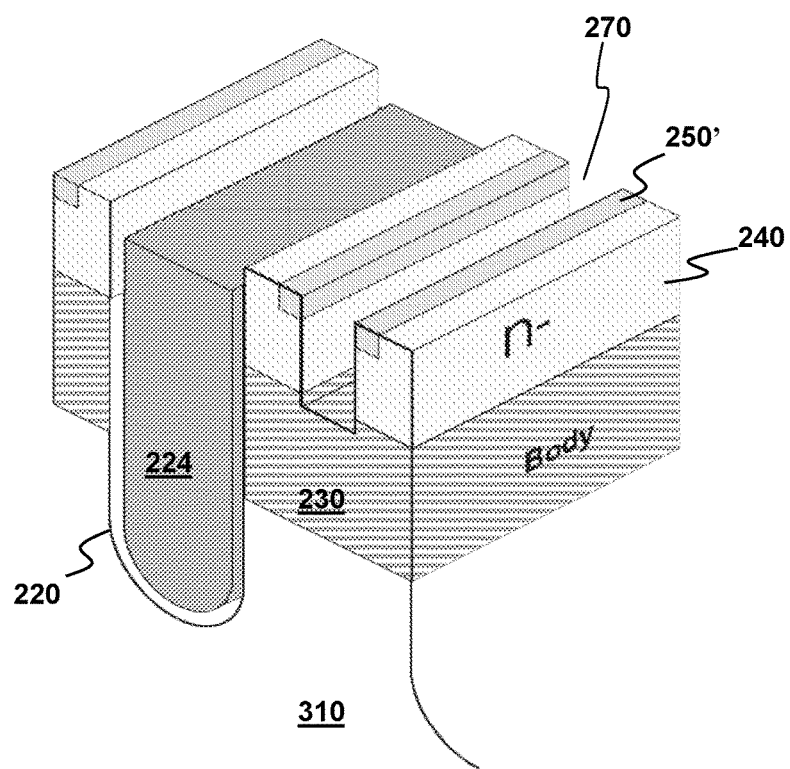
FIG. 3B is a three-dimensional view of a trench MOSFET device of FIG. 3A.

FIG. 3A illustrates a cross-sectional schematic diagram of portions of a trench MOSFET device according to another aspects of the present disclosure. FIG. 3B is a three-dimensional view of the trench MOSFET device of FIG. 3A. In the trench MOSFET device 300 of FIG. 3A or 3B, the heavily doped source regions 250' are formed in the lightly doped region 240 adjacent to the source contact trenches 270. In this implementation the heavily doped source regions 250' do not span the entire width of the region between the gate trench 220 and the source contact trench 270. Other than that, the configuration of the MOSFET device 300 of FIG. 3A is similar to the configuration of MOSFET device 200 of FIG. 2A, and thus the description of features common to both configurations is not repeated herein for simplicity.

FIGS. 4A-4J are cross-sectional views illustrating the fabrication process for forming a trench MOSFET 200 of FIG. 2A having a lightly doped source region between the heavily doped source region and the body region.

Figure 4A:
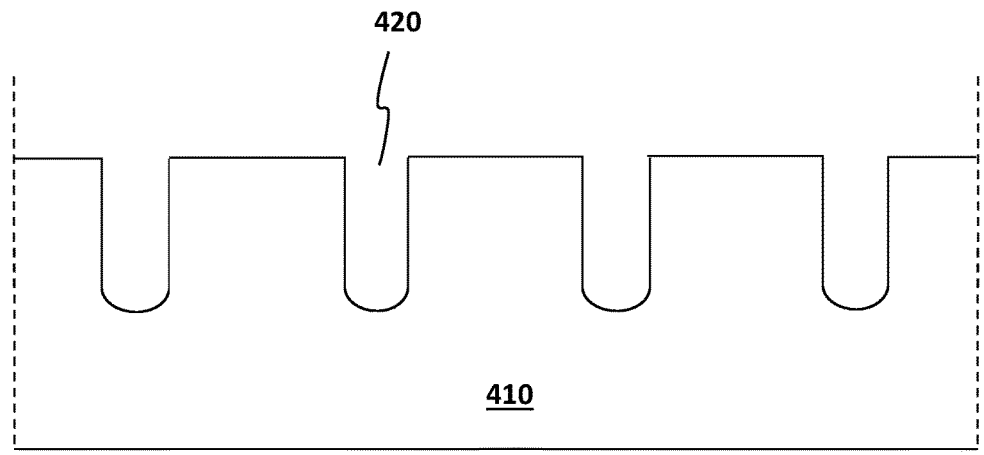
FIGS. 4A-4J are cross-sectional schematic diagrams illustrating a method for fabricating a trench MOSFET device of FIG. 2A according to aspects of the present disclosure.

Referring to FIG. 4A, the process uses a semiconductor substrate 410 of a first conductivity as a starting material. In some embodiments, the substrate 410 may include an N-type epitaxial layer on top of a heavily doped N type (N+) silicon wafer. A mask (not shown) applied on the substrate 410 includes openings to define locations of a plurality of gate trenches for the trench transistors of the MOSFET device 200. In FIG. 4A, an etching process is performed and the corresponding portions of the underlying substrate 410 are etched down to form a plurality of the gate trenches 420. Once the trenches 420 have been formed and the mask has been removed, a sacrificial oxide layer (not shown) may be grown and then removed to improve the silicon surface.

Figure 4B:
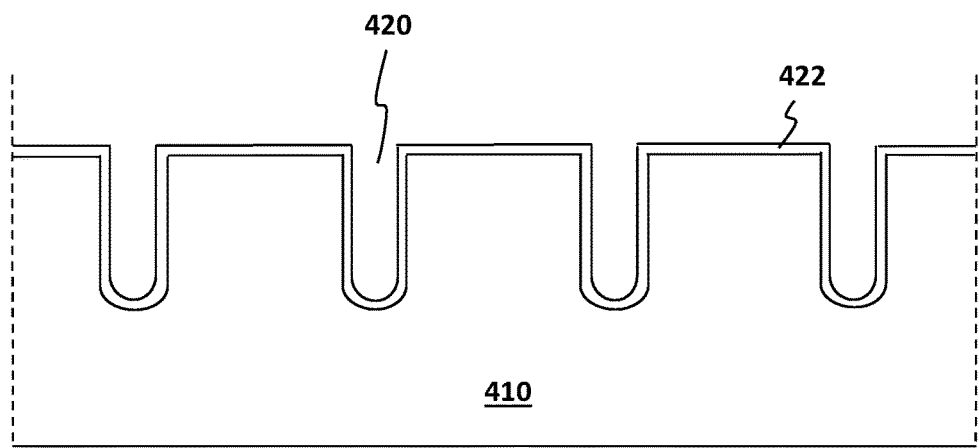
Figure 4C:
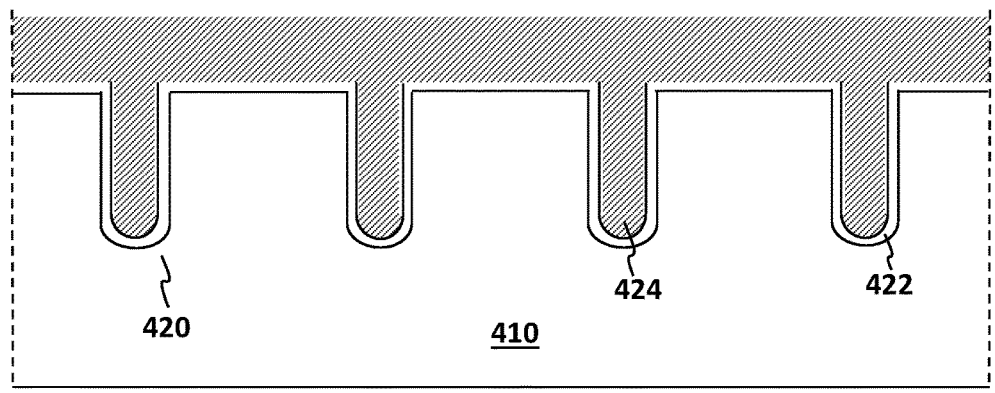
Figure 4D:
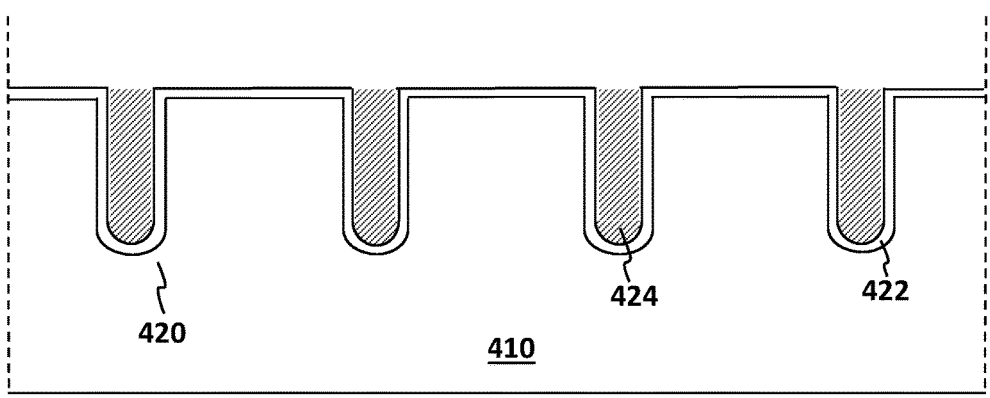

Referring to FIG. 4B, an insulating layer (e.g., gate oxide) 422 is then formed along the inner surface of the gate trenches 420. In FIG. 4C, a conductive material is then deposited over the gate oxide layer 422. In some embodiments, the conductive material can be in-situ doped or undoped polysilicon. A gate electrode 424 for each trench transistor is thus formed as shown in FIG. 4D after an etch-back process on the conductive material over the substrate 410.

Figure 4E:
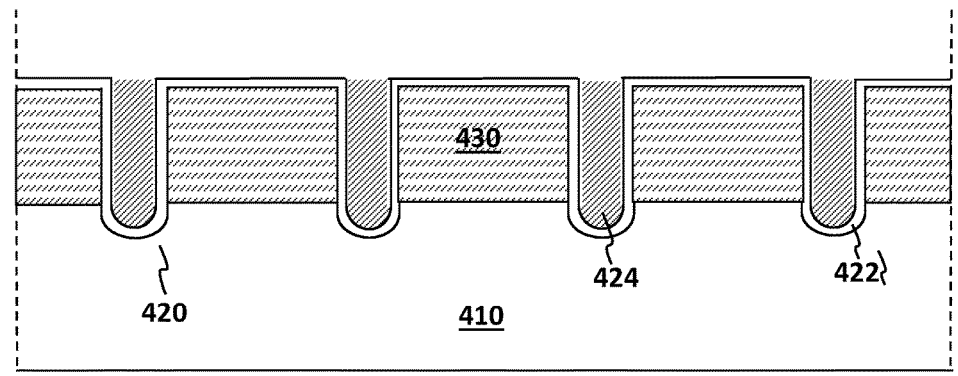

Referring to FIG. 4E, a blanket body implant is performed to form body regions 430. The dopant ions are of the opposite conductivity type to the doping of the substrate 410. In some embodiments, the dopant ions can be Boron ions for an N-channel device. In some embodiments, Phosphorous or Arsenic ions can be used for P-channel devices. Afterwards, a thermal diffusion is carried out to activate dopant atoms and drive dopant diffusion to form the body regions 430.

Figure 4F:
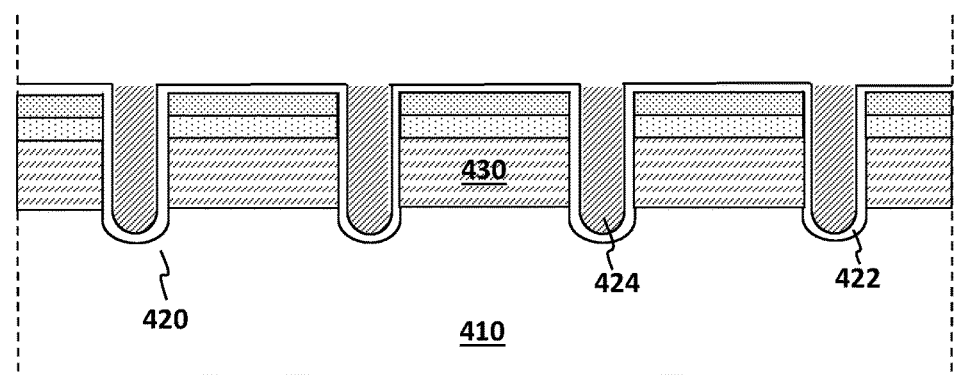
Figure 4G:
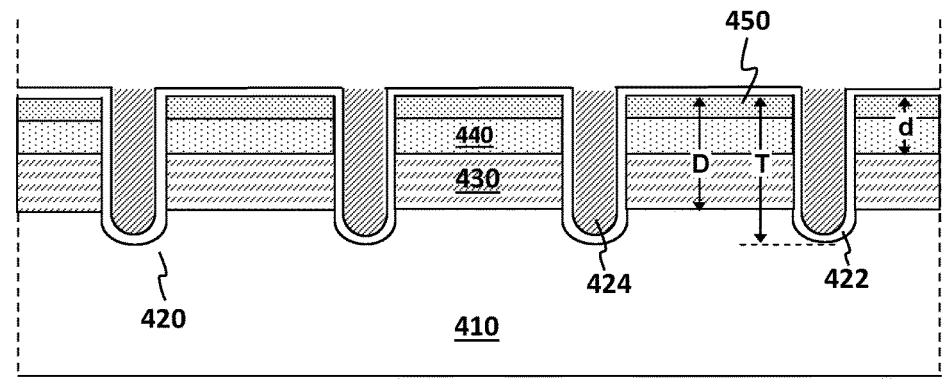

Referring to FIG. 4F, a source implant is performed. Specifically, the source implant is a combination of deep phosphorus (N−) implant and a shallow arsenic (N+) implant. Source region diffusion is then followed to form a lightly doped source region 440 in the body region 430 deeper than the heavily doped source region 450 as shown in FIG. 4G. By way of example and not by way of limitation, the doping concentration of the lightly doped source region 440 may range from about $1 \times 10^{15}/cm^3$ to about $1 \times 10^{18}/cm^3$ while the doping concentration of the heavily doped source region 450 may range from about $8 \times 10^{19}/cm^3$ to about $8 \times 10^{20}/cm^3$. By way of example and not by way of limitation, the lightly doped source region 440 may extend between the body region 430 and heavily doped source region 450. A depth D of the body region 430 may be between 0.5 T and 0.8 T, where T is the depth of the gate trench 420. The depth d of the lightly doped region 440 may be between 0.25 D and 0.5 D. The depth of the heavily doped source region 450 may be between 0.25 d and 0.5 d. The depth of the various regions may be controlled through control of the implantation energy, which is typically in a range from 10 keV to 500 keV.

Figure 4H:
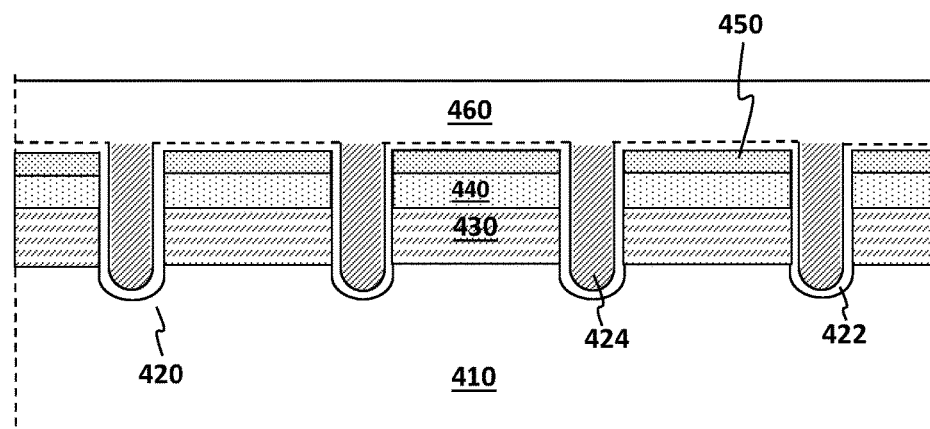

Subsequently, a planarized dielectric layer 460 is deposited over the substrate 410 as shown in FIG. 4H. In some embodiments, the dielectric layer 460 is formed by a low temperature oxide deposition followed by a deposition of Borophosphorosilicate Glass (BPSG).

Figure 4I:
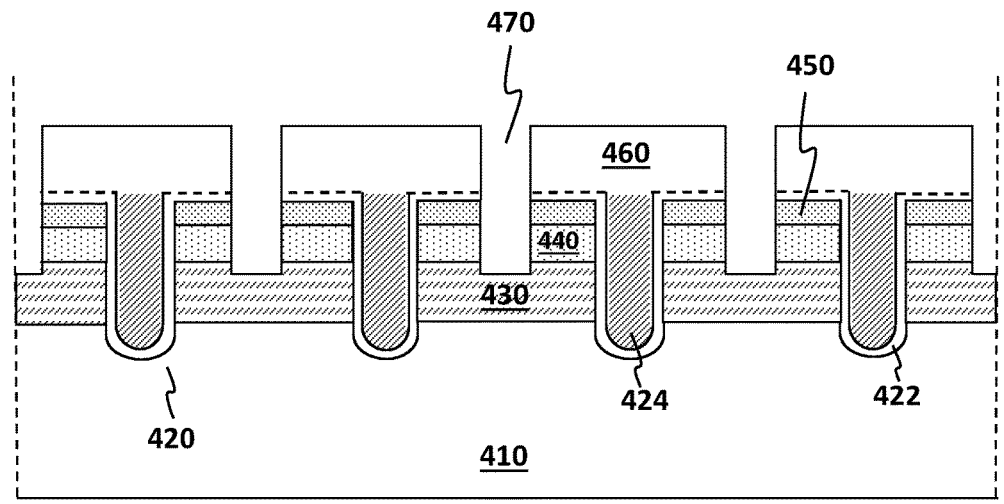
Figure 4J:
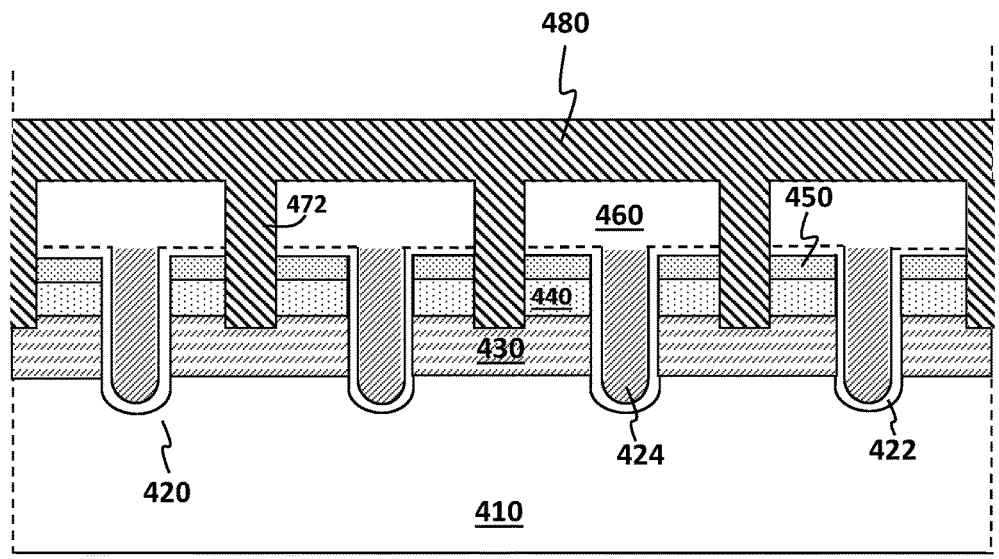

A photoresist (not shown) is then applied on the dielectric layer 460 with a pattern that has an opening at the locations of contact trenches. An etch process is performed to remove the uncovered portions of the dielectric layer 460 and form contact trenches 470 through the source region 430 into the body region 420 as shown in FIG. 4I. By way of example and not by way of limitation, the width of the contact trench 470 ranges from 0.5 µm to 1.5 µm.

A metal layer 480 is then deposited above the dielectric layer 460. A source contact 472 is formed in each source contact trench 470 by fill the contact openings with a conductive material. The metal layer 480 and the source contact 472 interconnect all the source regions to form the trench MOSFET device 200 with MOS transistors connected in parallel.

FIGS. 5A-5L are cross-sectional views illustrating the fabrication process for forming a trench MOSFET 300 of FIG. 3A having a heavily doped source region in the lightly doped source region adjacent to the source contact trench.

Figure 5A:
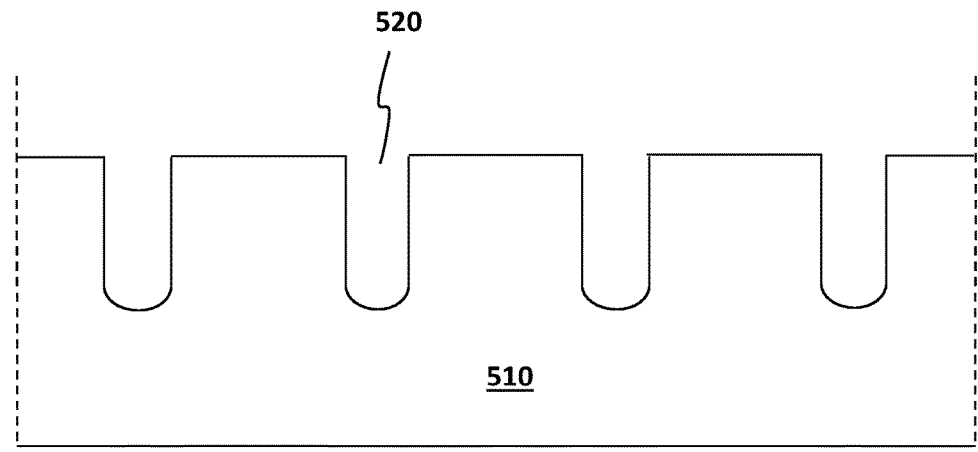
FIGS. 5A-5L are cross-sectional schematic diagrams illustrating a method for fabricating a trench MOSFET device of FIG. 3A according to aspects of the present disclosure.

Referring to FIG. 5A, the process uses a semiconductor substrate 510 of a first conductivity as a starting material. In some embodiments, the substrate 510 may include an N-type epitaxial layer on top of a heavily doped N type (N+) silicon wafer. A mask (not shown) applied on the substrate 510 includes openings to define locations of a plurality of gate trenches for the trench transistors of the MOSFET device 300. In FIG. 5A, an etching process is performed and the corresponding portions of the underlying substrate 510 are etched down to form a plurality of the gate trenches 520. Once the trenches 520 have been formed and the mask has been removed, a sacrificial oxide layer (not shown) may be grown and then removed to improve the silicon surface.

Figure 5B:
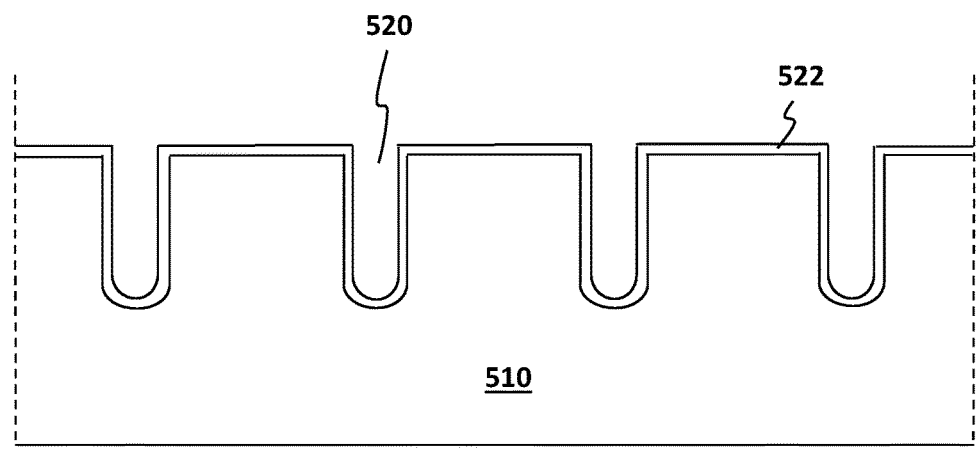
Figure 5C:
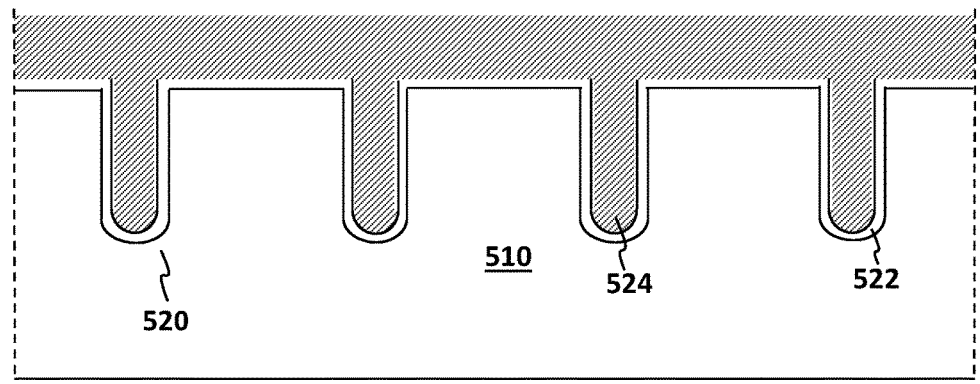
Figure 5D:
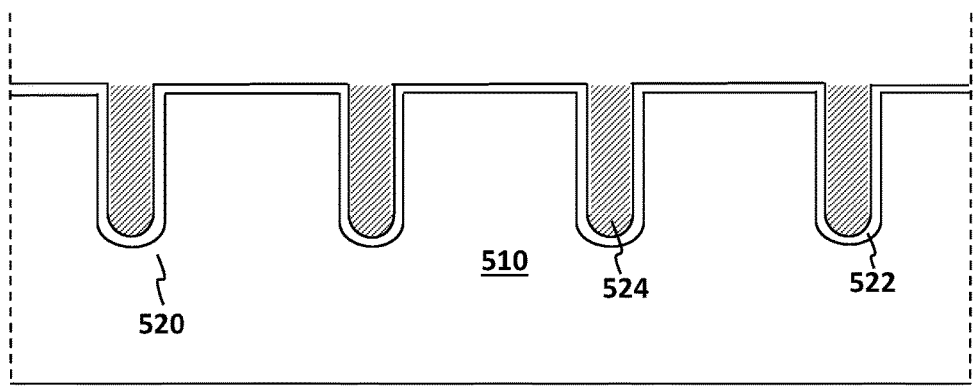

Referring to FIG. 5B, an insulating layer (e.g., gate oxide) 522 is then formed along the inner surface of the gate trenches 520. In FIG. 5C, a conductive material is then deposited over the gate oxide layer 522. In some embodiments, the conductive material can be in-situ doped or undoped polysilicon. A gate electrode 524 for each trench transistor is thus formed as shown in FIG. 5D after an etch back process on the conductive material over the substrate 510.

Figure 5E:
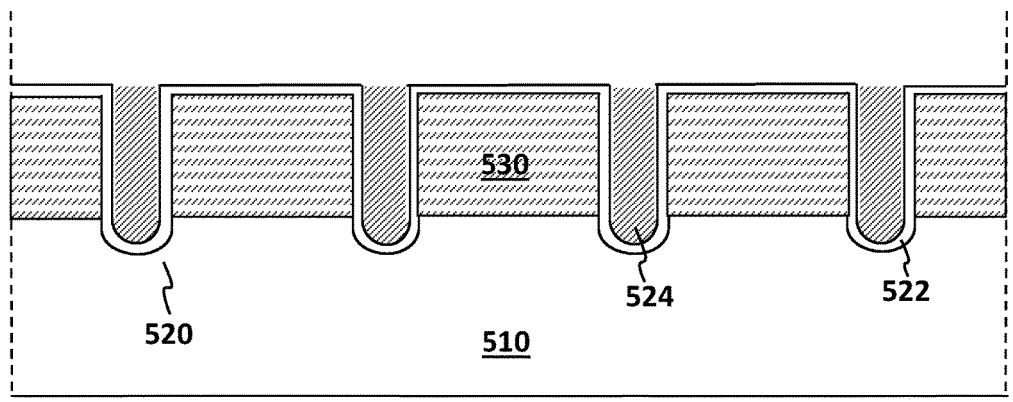

Referring to FIG. 5E, a blanket body implant is performed to form body regions 530. The dopant ions are of the opposite conductivity type to the doping of the substrate 510. In some embodiments, the dopant ions can be Boron ions for an N-channel device. In some embodiments, Phosphorous or Arsenic ions can be used for P-channel devices. A thermal diffusion is carried out to activate dopant atoms and drive dopant diffusion to form the body regions 530.

Figure 5F:
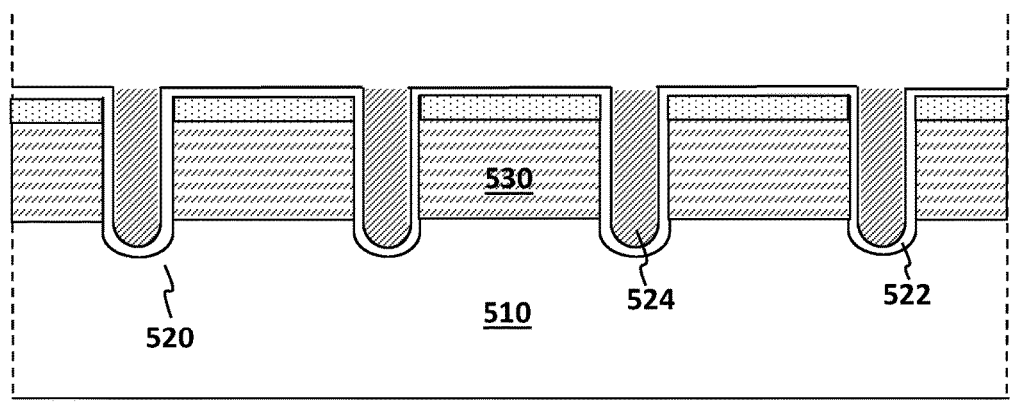
Figure 5G:
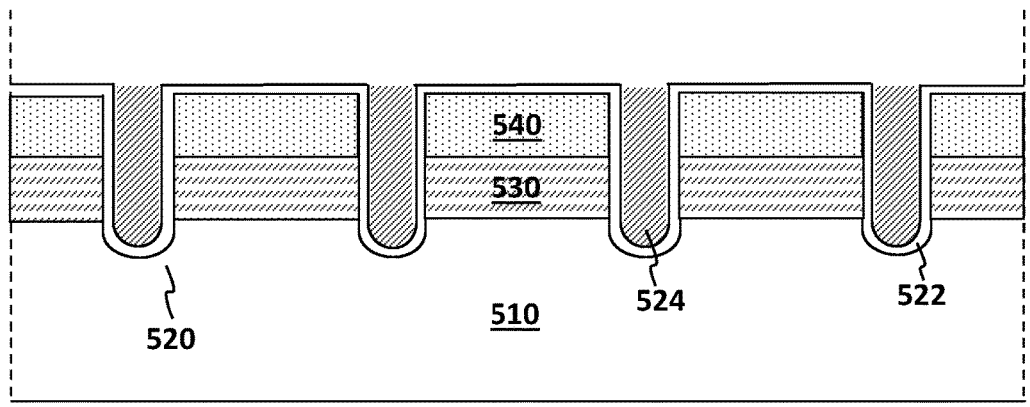

Referring to FIG. 5F, a deep source implant is performed. The dopant ions are of the same conductivity type to the doping of the substrate 510. In some embodiments, phosphorus ions can be implanted for an N-channel device. Source region diffusion is then followed to form a lightly doped source region 540 as shown in FIG. 5G. By way of example and not by way of limitation, the doping concentration of the lightly doped source region 540 may range from about $1\times10^{15}/cm^3$ to about $1\times10^{18}/cm^3$. The depth of the various regions may be controlled through control of the implantation energy, which is typically in a range from 10 keV to 500 keV.

Figure 5H:
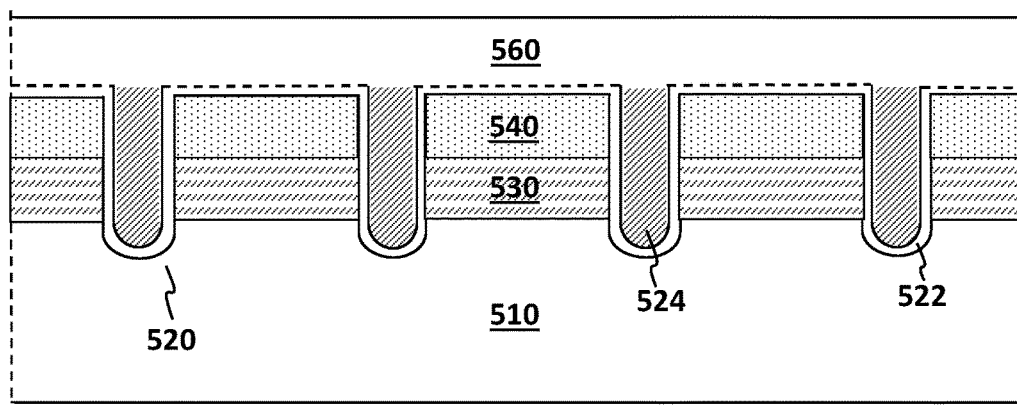

Subsequently, a planarized dielectric layer 560 is deposited over the substrate 510 as shown in FIG. 5H. In some embodiments, the dielectric layer 560 is formed by a low temperature oxide deposition followed by a deposition of Borophosphorosilicate Glass (BPSG).

Figure 5I:
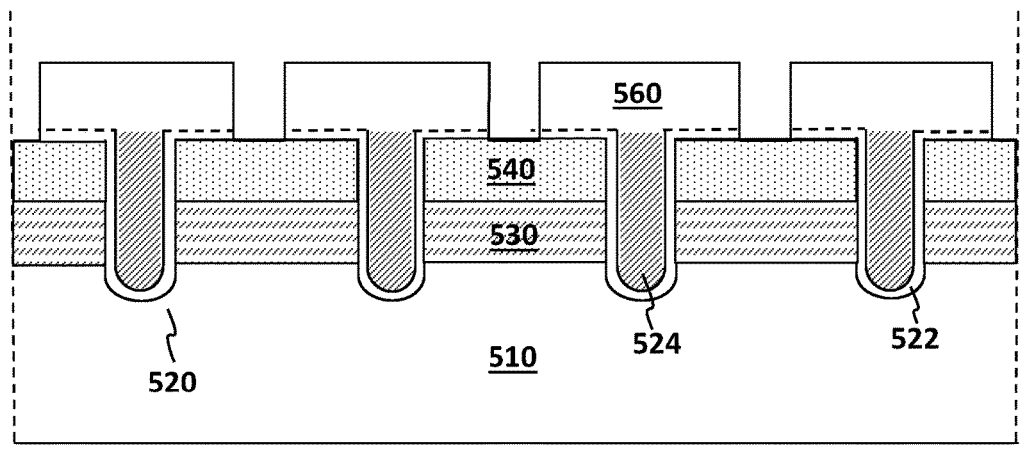

A contact photoresist (not shown) is then applied on the dielectric layer 560 with a pattern that has an opening at the locations of contact trenches. An etch process is performed to remove the uncovered portions of the dielectric layer 560 as shown in FIG. 5I.

Figure 5J:
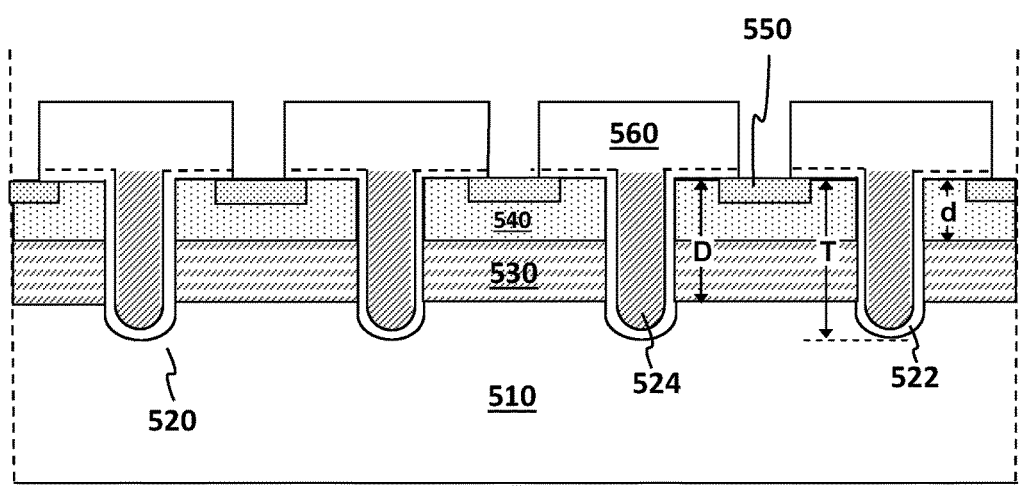

In FIG. 5J, a shallow source implant is performed followed by annealing for lateral diffusion to form the heavily doped source regions 550. The dopant ions are of the same conductivity type to the doping of the substrate 510. In some embodiments, arsenic ions can be implanted for an N-channel device. By way of example and not by way of limitation, the doping concentration of the heavily doped source region 550 may range from about $8\times10^{19}/cm^3$ to about $8\times10^{20}/cm^3$. The depth D of the body region 530 may be between 0.5 T and 0.8 T, where T is the depth of the gate trench 520. The depth d of the lightly doped region 540 may be between 0.25 D and 0.5 D. The depth of the source region 550 may be between 0.25 d and 0.5 d.

Figure 5K:
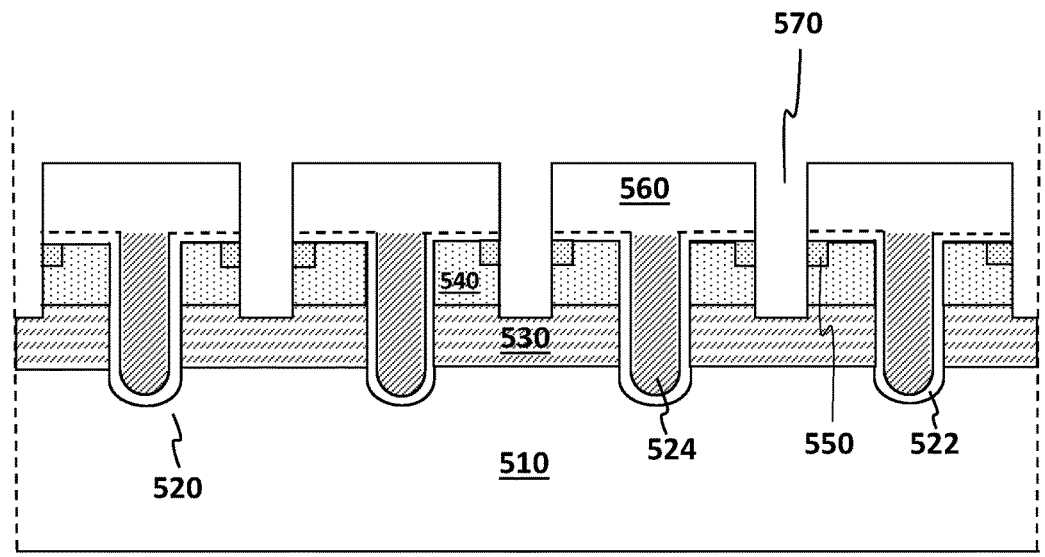
Figure 5L:
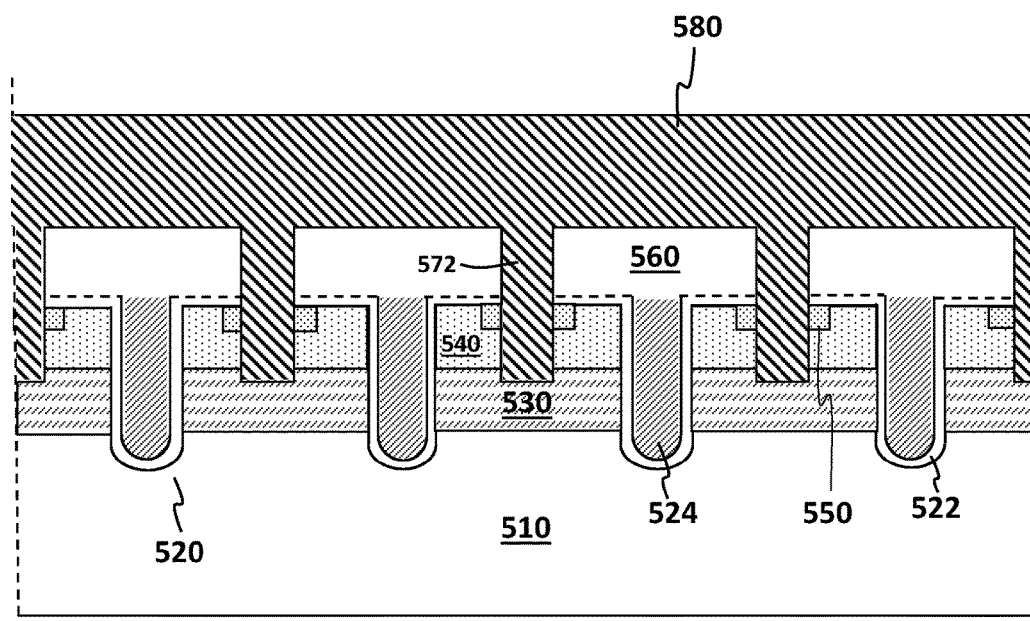

Referring to FIG. 5K, another etch process is perform to form the source contact trench 570 by etching through the source contact openings into the body region 530. By way of example and not by way of limitation, the width of the contact trench 570 ranges from 0.5 µm to 1.5 µm. A metal layer 580 is then deposited above the dielectric layer 560. A source contact 572 is formed in each source contact trench 570 by fill the contact openings with a conductive material. The metal layer 580 and the source contact 572 interconnect all the source regions to form the trench MOSFET device 300 with MOS transistors connected in parallel.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶ 6.

What is claimed is:

1. A trench metal-oxide-semiconductor field-effect transistor (MOSFET) device, comprising:
   a) a substrate of a first conductivity type, the substrate comprising an epitaxial layer of the first conductivity type provided on top of a heavily doped silicon wafer of the same conductivity type;
   b) a body region of a second conductivity type that is opposite to the first conductivity type formed above the substrate;

c) a gate trench formed in the body region and substrate, wherein the gate trench is lined with a dielectric layer and a gate electrode is formed in the gate trench;

d) a lightly doped source region and a heavily doped source region formed in the body region, wherein the lightly doped source region is extended deeper in the body region than the heavily doped source region; and e) a source contact extending to the body region formed in a source contact trench next to the gate trench, wherein the lightly doped source region is adjacent to the source contact trench and wherein a Schottky diode is formed at a contact between the source contact and the lightly doped source region, wherein the heavily doped source region extends fully between the gate trench and the source contact trench.

2. The device of claim 1, wherein a ballast resistor is formed at the lightly doped source region between the heavily doped source region and the body region.

3. The device of claim 2, wherein the ballast resistor has a length, wherein the length of the ballast resistor is adjusted by changing a depth of the heavily doped source region.

4. The device of claim 2, wherein the ballast resistor has a width, wherein the width of the ballast resistor is adjusted by a width of the source contact trench.

5. The device of claim 2, wherein the ballast resistor has a resistance value, wherein the resistance value is adjusted by a doping concentration of the lightly-doped source region.

6. The device of claim 1, wherein a depth D of the body region is between 0.5 T and 0.8 T, where T is the depth of the gate trench; wherein a depth d of the lightly doped source region is between 0.25 D and 0.5 D; and wherein a depth of the heavily doped source region is between 0.25 d and 0.5 d.

7. The device of claim 1, wherein the source contact trench has a width, wherein the width ranges from 0.5 μm to 1.5 μm.

8. The device of claim 1, wherein a doping concentration of the lightly doped source region ranges from about $1\times10^{15}/cm^3$ to about $1\times10^{18}/cm^3$ and a doping concentration of the heavily doped source region ranges from about $8\times10^{19}/cm^3$ to about $8\times10^{20}/cm^3$.

* * * * *